United States Patent
O'Neal et al.

(10) Patent No.: US 7,996,185 B2
(45) Date of Patent: Aug. 9, 2011

(54) MACHINE DATA ACQUISITION SYSTEM WITH DATA COMPRESSION

(75) Inventors: Steven Wayne O'Neal, Bartonville, IL (US); Mark Ryan Hazen, Bloomington, IL (US); Todd Philip Cole, Washington, IL (US); David Charles Janik, Normal, IL (US); Joseph Anthony Lang, Edwards, IL (US)

(73) Assignee: Caterpillar Inc., Peoria, IL (US)

( * ) Notice: Subject to any disclaimer, the term of this patent is extended or adjusted under 35 U.S.C. 154(b) by 82 days.

(21) Appl. No.: 12/149,220

(22) Filed: Apr. 29, 2008

(65) Prior Publication Data

US 2009/0271151 A1    Oct. 29, 2009

(51) Int. Cl.
*G06F 17/40* (2006.01)

(52) U.S. Cl. .......................................................... 702/187
(58) Field of Classification Search .................... 702/187
See application file for complete search history.

(56) References Cited

U.S. PATENT DOCUMENTS

| | | | |
|---|---|---|---|
| 4,926,331 A | 5/1990 | Windle et al. | |
| 5,852,793 A * | 12/1998 | Board et al. | 702/56 |
| 5,854,994 A | 12/1998 | Canada et al. | |
| 6,026,348 A | 2/2000 | Hala | |
| 6,507,804 B1 * | 1/2003 | Hala et al. | 702/182 |
| 6,970,075 B2 | 11/2005 | Cherouny et al. | |
| 7,042,347 B2 | 5/2006 | Cherouny | |
| 7,203,560 B1 | 4/2007 | Wylie et al. | |
| 2003/0114965 A1 | 6/2003 | Fiechter et al. | |
| 2006/0006991 A1 * | 1/2006 | Tyndall et al. | 340/442 |
| 2006/0111822 A1 | 5/2006 | Simon | |
| 2007/0078614 A1 | 4/2007 | Discenzo et al. | |

* cited by examiner

*Primary Examiner* — Aditya Bhat
(74) *Attorney, Agent, or Firm* — Finnegan, Henderson, Farabow, Garrett & Dunner LLP

(57) ABSTRACT

A machine data acquisition system is disclosed. The data acquisition system may include a sensor disposed on a machine and configured to produce a signal indicative of an operational parameter of the machine. The system may also include a data processor and controller configured to convert the signal into a plurality of parameter data points. The system may further include a primary data circular buffer disposed on the machine and configured to store the plurality of parameter data points. Additionally, a variable resolution circular buffer may be disposed on the machine and configured to store a compressed parameter data point calculated from the plurality of parameter data points.

21 Claims, 8 Drawing Sheets

MACHINE DATA ACQUISITION SYSTEM WITH DATA COMPRESSION

TECHNICAL FIELD

The present disclosure relates generally to a machine data acquisition system, and more particularly, to a machine data acquisition system with data compression.

BACKGROUND

Machines such as, for example, passenger vehicles, trains, marine vessels, construction equipment, excavating machines, assembly line production equipment, etc., are often equipped with sensors for measuring operational parameters of the machine. These operational parameters may include, for example, engine RPM, oil pressure, water temperature, boost pressure, oil contamination, electric motor current, hydraulic pressure, system voltage, fuel consumption, payload, ground speed, transmission ratio, cycle time, and other parameters indicative of machine health, status, or performance. Storage devices may be provided on the machine to compile an operational parameters database or log for near real-time evaluation or for later evaluation of machine performance.

During operation, it may be beneficial to monitor the sensed operational parameters of a machine to diagnose and/or analyze its performance. As such, systems have been provided to monitor machine operational parameters and log faults, report events and parameter data points, and/or provide alerts in response to the monitored operational parameters. In some instances, the faults, events, and/or alerts may be communicated to one or more off-board systems responsible for tracking the operations of one or more machines (e.g., a fleet). For example, in response to oil pressure falling below a predetermined value and/or surpassing a predetermined contamination threshold, an oil change alert may be stored in a machine maintenance log, reported to the machine operator, and/or communicated to an off-board system.

In diagnosing an alert or malfunction, it is helpful to have data for some duration before the fault or event of interest occurred. However, the machine may have limited opportunity to communicate with the off-board system or may have limited bandwidth to communicate with the off-board system. The machine may also have a limited storage capacity, and may discard old data as new data becomes available. To increase the amount of useful data available while not having to increase memory on the machine or add bandwidth to the communications link, a method or system is needed to compress one or more parameter data points of one or more parameters.

One machine health monitoring system with data compression is described in U.S. Pat. No. 6,507,804 (the '804 patent) issued Jan. 14, 2003 to Hala et al. The '804 patent describes a method and apparatus for compressing, storing, and transmitting measurement data correlating to machine status. The method and apparatus sense the signal and extracts significant spectral elements, including magnitude and phase. Each set of spectral elements is compared to a previous set of spectral elements, and the new set is stored only if the sets vary by a user definable amount.

Although the machine monitoring system of the '804 patent may reduce the amount of memory required to store data, it has several shortcomings. For example, the method and apparatus of the '804 patent processes sensed signals, and not the parameter data points those signals represent. For instance, the method and apparatus of the '804 patent are designed for waveforms, such as rotational speed, and may not be suitable for a discrete value, such as a temperature or pressure. Additionally, the method and apparatus of the '804 patent are designed to process sensed signals rather than the products calculated from other parameter data points. For example, when a fan speed is calculated from the sensed pulse rate, the method and apparatus of the '804 patent may not reduce the memory space to store the calculated fan speed. A further drawback of the method and apparatus of the '804 patent is an inability to provide information on the predictability and variability of the compressed parameter data points, for example, by tracking the variance and mean square error of a linear progression of sensed parameter data points over time that are compressed into a single sensed parameter data point.

The disclosed system and method are directed to improvements in the existing technology.

SUMMARY

One aspect of the disclosure is directed to a data acquisition system. The data acquisition system may include a sensor disposed on a machine and configured to produce a signal indicative of an operational parameter of the machine. The system may also include a data processor and controller configured to convert the signal into a plurality of parameter data points. The system may further include a primary data circular buffer disposed on the machine and configured to store the plurality of parameter data points. Additionally, a variable resolution circular buffer may be disposed on the machine and configured to store a compressed parameter data point calculated from the plurality of parameter data points.

Another aspect of the disclosure is directed to a method of acquiring machine data. The method may include sensing a signal associated with an operational parameter of the machine and converting the sensed signal into a plurality of parameter data points. The method may also include storing the plurality of parameter data points in a primary circular data buffer, and compressing and storing a compressed parameter data point in a variable resolution circular buffer.

DETAILED DESCRIPTION

Figure 1:
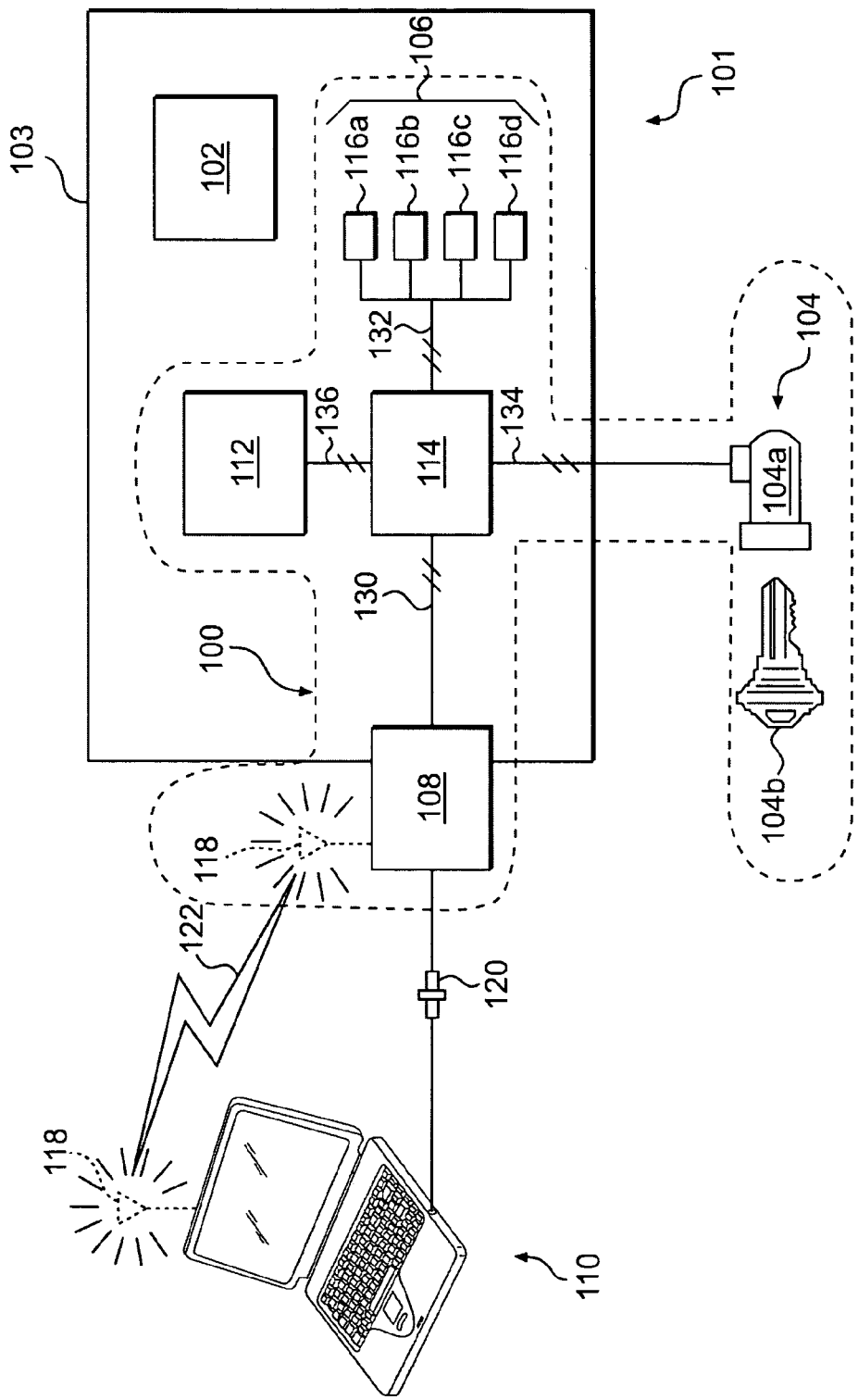
FIG. 1 is an exemplary diagram of a machine with a data acquisition system.

FIG. 1 shows an exemplary data acquisition system 100 included in a machine 101. Machine 101 may be a fixed or mobile machine that performs some type of operation associated with an industry such as mining, construction, farming, transportation, or any other type of industry. For example, machine 101 may be an earth-moving machine, a generator set, a pump, a passenger vehicle, a marine vessel, or any other suitable operation-performing machine. Machine 101 may include a power source 102 and frame 103.

Power source 102 may include one or more devices configured to provide power for the operation of machine 101. These devices may include, for example, an electric motor, an engine, a battery, etc. In an exemplary embodiment, power source 102 may include an engine, such as, for example, a diesel engine, a gasoline engine, a steam engine, etc. In addition, any other engine configurable to provide power for the operation of machine 101 may be used as power source 102. Power source 102 may be operatively coupled to frame 103. Frame 103 may provide support to power source 102, and any other systems or attachments of machine 101.

Data acquisition system 100 may include an identification module 104, one or more interface modules 106, a communication module 108 configured to communicate with an off-board system 110, and an operator interface 112 communicatively connected to a data processor and controller 114. It is contemplated that, in some embodiments, one or more of identification module 104, one or more interface modules 106, communication module 108, and data processor and controller 114 may be integrated as a single unit.

Identification module 104 may include any means for receiving an operator identification code and generating a signal indicative of the code. In some embodiments, the code may be used for the purpose of identifying an operator who is controlling machine 101. Such means may include, for example, a switch 104a configured to receive, sense, and/or detect a coded key 104b. The coded key may be, for example, a key having magnetic information thereon, a memory chip embedded thereon, and/or an electromagnetic identification circuit included thereon. Other means may include, for example, a keypad allowing the code to be manually entered by an operator, a data port allowing direct communication with a service tool or a computer having the code, an antenna allowing reception of the code from a remote location, a scanner configured to read coded indicia, or any other configuration that can receive the code and generate a signal indicative of the code. For example, coded key 104b may be a radio-frequency identification (RFID) chip having an operator code, and switch 104a may be a radio-frequency sensor configured to sense and read the operator code within a certain proximity. A code, for the purposes of the present disclosure, may include a configuration of letters, numbers, symbols, pulses, voltage levels, indicia, signals, magnetic fields, sound or light waves, and other configurations that represent an assigned meaning. The code may take the form of one or more human readable information and machine readable information. It is contemplated that identification module 104 may receive additional pieces of coded information other than an operator identification code.

Interface module 106 may include a plurality of sensors 116a-d distributed throughout machine 101 to gather data from various components and subsystems of machine 101. It is contemplated that a greater or lesser number of sensors 116a-d may be included than shown in FIG. 1. Sensors 116a-d may be associated with and/or monitor a power source, a transmission, a traction device, a tool, an exhaust system, a suspension system, and/or other components and subsystems of machine 101. These sensors 116a-d may measure and/or sense operational parameters based on the gathered sensor signals, such as, for example, engine RPM, ground speed, track/wheel slip, oil pressure, water temperature, boost pressure, oil contamination, exhaust temperature, NOx level, urea level, electric motor current, hydraulic pressure, system voltage, fuel consumption, payload weight, ground speed, distance traveled, transmission ratio, cycle time, start time, stop time, grade, a global or relative position of machine 101, brake temperature, etc. Sensors 116a-d may each generate a signal corresponding to a value of the respective measured operational parameter (e.g., 170° F., 1.5 atm, 1,200 RPM, etc.). Other information may be generated or maintained by interface module 106 such as, for example, time of day, date, etc.

Communication module 108 may include any device configured to facilitate communications between data processor and controller 114 and off-board system 110. Communication module 108 may include hardware and/or software (e.g., a multiplexer/demultiplexer, a transceiver, a signal modulator, an amplifier, an antenna 118, etc.) that enables communication module 108 to send and/or receive data messages through a direct data link 120 and/or a wireless communication link 122. Wireless communication link 122 may include satellite, cellular, infrared, radio (RF), or another suitable band of electromagnetic radiation that enables data processor and controller 114 to wirelessly exchange information with off-board system 110.

Off-board system 110 may represent one or more computing systems of an entity associated with machine 101, such as a manufacturer, dealer, retailer, owner, or any other entity that generates, maintains, sends, and/or receives information associated with machine 101. The one or more computing systems may include a work station, a personal digital assistant, a laptop, a desktop, a mainframe, and/or other computing systems known in the art. Off-board system 110 may include any means for sending and/or receiving machine operational parameter-related instructions from a user and/or for directly communicating with communication module 108 via direct data link 120 or wireless communication link 122. For example, off-board system 110 may include one or more of a keyboard, a mouse, a monitor, a touch-screen, a data port, communications hardware and software, network interface and architecture, etc. Communications may include wireless telephone messages, pages, text-messages (e.g., SMS, etc.), electronic mail, packets, packet batches, or another desired communications packaging. Off-board system 110 may include computer-readable storage components, such as, for example, read-only memories (ROM), random-access memories (RAM), and/or flash memory; secondary storage device(s), such as a tape-drive, an optical disk drive, and/or a magnetic disk drive; microprocessor(s) (CPU); and/or other components for operating an application.

Operator interface 112 may include one or more of a monitor, a touch-screen, a portable hand-held device, a keypad, or another suitable interface. Operator interface 112 may receive input from a machine 101 operator and generate corresponding command signals in response to the input. In some embodiments, operator interface 112 may display data corresponding to machine status and/or performance in response to signals from data processor and controller 114.

Data processor and controller 114 may include means for receiving parameter-related instructions from off-board system 110 and for monitoring, recording, storing, indexing, processing, converting, calculating, and/or communicating parameter data points to off-board system 110. These means may include components such as, for example, a memory, one or more data storage devices, microprocessor(s), or any other components that may be used to run an application. Data processor and controller 114 may receive operational data and/or input commands directly from a machine 101 operator during operation of machine 101 by way of operator interface 112. Data processor and controller 114 may embody, for example, an electronic control module (ECM), a telematics control module, and/or other similar processing devices.

Data processor and controller 114 may be in communication with the various components and subsystems of machine 101 via identification module 104, interface module 106, communication module 108, and operator interface 112 by way of communication links 130, 132, 134, and 136, respectively. Furthermore, although aspects of the present disclosure may be described generally as being stored in memory, one skilled in the art will appreciate that these aspects can be stored on or read from types of computer program products or computer-readable media, such as computer chips and secondary storage devices, including hard disks, floppy disks, optical media, CD-ROM, or other forms of RAM or ROM. Various other known circuits may be associated with data processor and controller 114 such as, for example, power supply circuitry, signal-conditioning circuitry, solenoid driver circuitry, timing circuitry, communication circuitry, and other suitable circuitry.

Data processor and controller 114 may include one or more tables, arrays, matrices, or other suitable data storage structures in memory to facilitate parameter data point storage, event detection, and reporting of parameter data points and events. In one exemplary embodiment, data processor and controller 114 may include a table having a first dimension (e.g., rows) indexed by event and a second dimension (e.g., columns) indexed by operational parameter. The cells of the table may be appropriately marked and/or flagged so as to indicate the operational parameter(s) to be monitored for each respective event. The cells may also include a predetermined value for the operational parameter that may trigger the occurrence of an event. Further, the table may suitably indicate which operational parameters should be returned, reported, and/or stored in memory when an event is triggered. Although the example of rows is used for the first dimension and the example of columns for the second dimension, other methods of indexing and dimensions may also be used.

Certain events of interest that may be included in the table(s) and detected by data processor and controller 114 during operation include, for example, brake overheat, payload overload, payload under-load, engine stall, poor road conditions, exhaust overheating, exhaust contamination, fuel inefficiency, etc. It is to be appreciated that any suitable combination of the operational parameters discussed above may be used to detect and/or report the occurrence of one or more events. For example, individual brake temperatures may be monitored to detect a brake overheat event. When a brake overheat event occurs (i.e., when a measured temperature of the monitored brake(s) exceeds a threshold temperature previously set by the user and/or machine 101 operator), various parameter data points may be returned, including, for example, GPS location, groundspeed, stopping distance, brake temperatures, payload weight, and/or an operator identification number. Any desired number and combination of parameter data points may be selected to trigger an event, and selected for reporting in response to the triggered event.

During machine 101 operation, data processor and controller 114 may, among other things, monitor, sample, and/or otherwise track the signals sensed by sensors 116*a-d*. Monitoring may be continuous, periodic, on-demand, etc. Data processor and controller 114 may convert the sensed signals into machine storable parameter data points, for example, a digital representation of the signal or a digitally represented value or state. Data processor and controller 114 may access the table(s) discussed above and compare the parameter data points to one or more target parameter values selected by the sensed signals, formulas, and other users or operators for each event listed in the table. It is contemplated that some triggers and/or reported parameter data points may be set to default values, if desired.

When data processor and controller 114 determines an event has been triggered based on the comparison, data processor and controller 114 may report the event. That is, data processor and controller 114 may determine which operational parameters have been selected by the user or operator for reporting in association with the triggered event by referencing the table, and determine parameter data points for each of the operational parameters associated with the event based on the signals provided by sensors 116*a-d*. Data processor and controller 114 may then store in memory a report of the event, including the parameter data point of each of the operational parameters (e.g., a machine operation log). Data processor and controller 114 may communicate the event, by way of communication module 108, to off-board system 110 for storage or logging in an off-board memory, if direct data link 120 or wireless communication link 122 is available. Data processor and controller 114 may also provide an alert to the operator by way of operator interface 112, depending on the nature of the event and previous selections made by the user and/or operator.

Communication links 130, 132, 134, and 136 may include any suitable combination of wired and/or wireless links known in the art. In one embodiment, communications may be executed according to any protocols based on one or more known industry standards, such as, for example, SAE J1587, SAE J1939, RS-132, RP 110, RS-232, RS-322, RS-485, USB, MODBUS, SAEJ1587, Bluetooth, IEEE 702.11, IEEE 702.16, etc. Further, the communications may be facilitated by wired and/or wireless network architecture, such as, for example, a cellular telephone-based network (such as a PBX or POTS), a satellite-based network, a local area network (LAN), a wide area network (WAN), a controller area network (CAN), a dedicated intranet, the Internet, and/or any other suitable network architecture known in the art.

Figure 2:
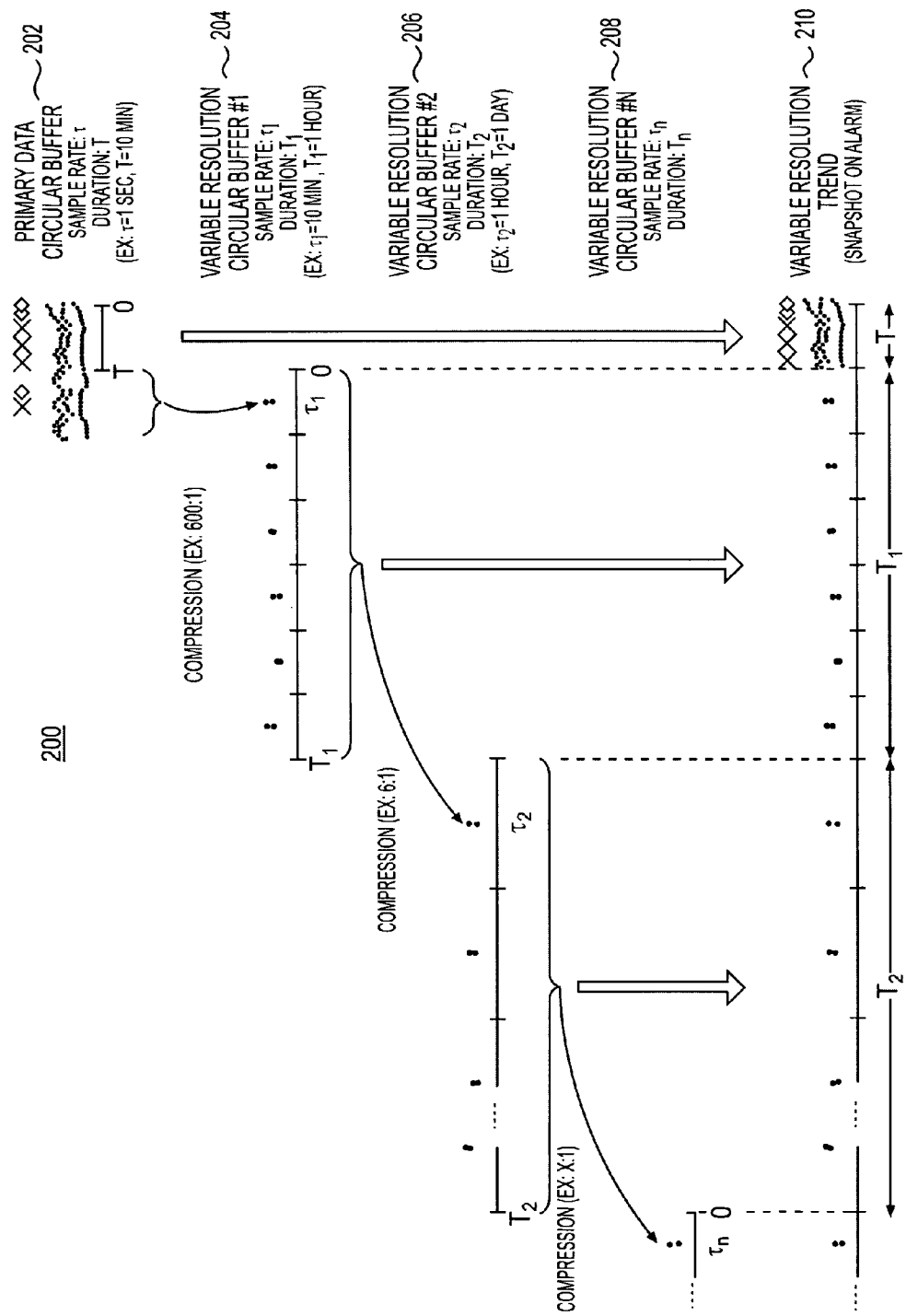
FIG. 2 is an exemplary diagram, illustrating an exemplary data compression method consistent with certain disclosed embodiments.

FIG. 2 shows an exemplary parameter data point compression method 200 for implementing parameter data point compression in accordance with this disclosure. It is to be appreciated that parameter data point compression method 200 may be executed and provided on machine 101, but may also be executed and provided on off-board system 110. Parameter data point compression method 200 may include a primary data circular buffer 202 and one or more variable resolution circular buffers 204, 206, 208. Parameter data point compression method 200 may be able to produce a variable resolution trend 210.

As shown in FIG. 2, primary data circular buffer 202 and one or more variable resolution circular buffers 204, 206, 208 may be circular buffers. A circular buffer may be a data structure that uses a single, fixed size buffer as if it were connected end-to-end. A circular buffer may use two or more pointers to indicate at least the oldest data entry and the current data entry. A circular buffer may be implemented with software, such as, for example, a table in memory, or hardware, such as, for example, a set of registers. Circular buffers may use a first in, first out (FIFO) system for data overflows. Each operational parameter may have its own primary data circular buffer 202 and one or more variable resolution circular buffers 204, 206, 208. While primary data circular buffer 202 and one or more variable resolution circular buffers 204, 206, 208 and operational parameters may be discussed in the singular, it should be understood that data acquisition system 100 may have many operational parameters and corresponding sets of primary data circular buffers 202 and one or more variable resolution circular buffers 204, 206, 208.

Primary data circular buffer 202 may store one or more parameter data points. Primary data circular buffer 202 may have a sample rate of tau ($\tau$) and a duration of T. For example, if $\tau$ equals 1 second, and T equals 10 minutes, primary data circular buffer 202 may hold 600 parameter data points for an operational parameter (600 parameter data points spaced one second apart). Primary data circular buffer 202 may use a first in, first out (FIFO) system for data overflows. In one exemplary embodiment, when primary data circular buffer 202 is full, the parameter data points may be compressed into a single first degree compressed parameter data point, with an attendant time stamp and time period. In a further exemplary embodiment, additional information about or associated with the compression may also be retained, such as the variance and mean square error associated with the parameter data points that were compressed. As will be discussed later, the compression may be for all parameter data points in primary data circular buffer 202, or a designated number of parameter data points, either starting from the earliest parameter data point in time in primary data circular buffer 202 or from a set value, such as the last parameter data point used in the previous compression.

First variable resolution circular buffer 204 may store one or more first degree compressed parameter data points of one or more operational parameters. First variable resolution circular buffer 204 may have a sample rate of tau ($\tau 1$) and a duration of T1. For example, if $\tau 1$ equals 10 minutes, and T1 equals 1 hour, first variable resolution circular buffer 204 may hold 6 parameter data points for an operational parameter. First variable resolution circular buffer 204 may use a first in, first out (FIFO) system for data overflows. In one exemplary embodiment, when first variable resolution circular buffer 204 is full, the first degree compressed parameter data points may be further compressed into a single second degree compressed parameter data point, with an attendant time stamp and time period. In a further exemplary embodiment, additional information about or associated with the compression may also be retained, such as the variance and mean square error associated with the first degree compressed parameter data points that were compressed. As will be discussed later, the compression may be for all parameter data points in first variable resolution circular buffer 204, or a designated number of parameter data points, either starting from the earliest first degree compressed parameter data point in time in first variable resolution circular buffer 204 or from a set value, such as the last first degree compressed parameter data point used in the previous compression.

Second variable resolution circular buffer 206 may store one or more second degree compressed parameter data points of one or more operational parameters. Second variable resolution circular buffer 206 may have a sample rate of tau ($\tau 2$) and a duration of T2. For example, if $\tau 2$ equals 1 hour, and T2 equals 1 day, second variable resolution circular buffer 206 may hold 24 parameter data points for an operational parameter. Second variable resolution circular buffer 206 may use a first in, first out (FIFO) system for data overflows. In one exemplary embodiment, when second variable resolution circular buffer 206 is full, the second degree compressed parameter data points may be further compressed into a single compressed third degree parameter data point, with an attendant time stamp and time period. In a further exemplary embodiment, additional information about or associated with the compression may also be retained, such as the variance and mean square error associated with the second degree compressed parameter data points that were compressed. As will be discussed later, the compression may be for all parameter data points in second variable resolution circular buffer 206, or a designated number of parameter data points (e.g., a subset of parameter data points), either starting from the earliest second degree compressed parameter data point in time in second variable resolution circular buffer 206 or from a set value, such as the last second degree compressed parameter data point used in the previous compression.

Third or $n^{th}$ variable resolution circular buffer 208 may store one or more third or $n^{th}$ degree compressed parameter data points of one or more operational parameters. Third or $n^{th}$ variable resolution circular buffer 208 may have a sample rate of tau ($\tau n$) and a duration of Tn. For example, if $\tau m$ may equal 1 month, and Tn may equal 5 years, third or $n^{th}$ variable resolution circular buffer 208 may hold 60 parameter data points for an operational parameter. Third or $n^{th}$ variable resolution circular buffer 208 may use a first in, first out (FIFO) system for data overflows. In one exemplary embodiment, when third or $n^{th}$ variable resolution circular buffer 208 is full, the third or $n^{th}$ degree compressed parameter data points may be further compressed into a single compressed fourth or $n^{th}+1$ degree parameter data point, with an attendant time stamp and time period. If no additional variable resolution circular buffer 208 is available, then FIFO may be applied, and the oldest third or $n^{th}$ degree compressed parameter data point is overwritten with the newest third or $n^{th}$ degree compressed parameter data point in third or $n^{th}$ variable resolution circular buffer 208. In a further exemplary embodiment, additional information about or associated with the compression may also be retained, such as the variance and mean square error associated with the fourth or $n^{th}+1$ degree compressed parameter data points that were compressed. As will be discussed later, the compression may be for all parameter data points in third or $n^{th}$ variable resolution circular buffer 208, or a designated number of parameter data points, either starting from the earliest third or $n^{th}$ degree compressed parameter data point in time in third or $n^{th}$ variable resolution circular buffer 208 or from a set value, such as the last third or $n^{th}$ degree compressed parameter data point used in the previous compression.

When communication module 108 is able to establish direct data link 120 or wireless communication link 122 with off-board system 110, either as a result of scheduled reports, return of availability of direct data link 120 or wireless communication link 122, or as the result of the occurrence of an event, variable resolution trend 210 may be sent by data processor and controller 114 through communication module 108 to off-board system 110. Variable resolution trend 210 contains the parameter data points of interest over a span of time, such as, for example, T plus T1 plus T2. Continuing the exemplary embodiment, variable resolution trend 210 would contain 600 parameter data points spaced by 1 second from an event triggering a report, six first degree compressed parameter data points with attendant time stamp and time period, spaced ten minutes apart, covering a duration of 1 hour, and 24 second degree compressed parameter data points with attendant time stamp and time period, spaced 1 hour apart, covering a duration of 24 hours, for a total duration of 1 day, 1 hour, and 6 minutes. The density in time of parameter data points reported to off-board system 110 may be most dense near the triggering event or time of reporting, and the density in time of parameter data points may become less dense in time further away from the triggering event or time of reporting.

Figure 3:
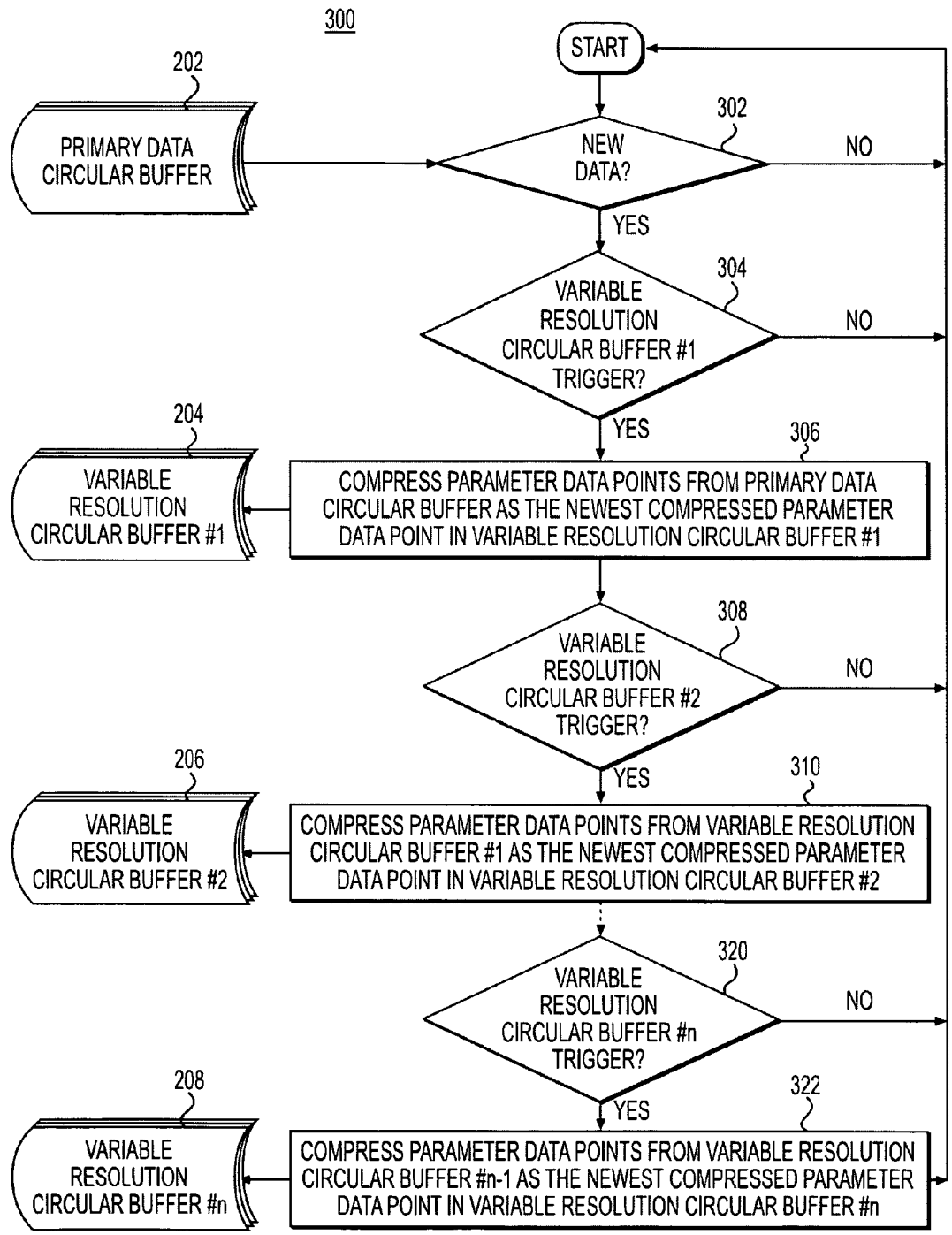
FIG. 3 is a flow chart illustrating one embodiment of an exemplary data compression method to compress parameter data points and store compressed parameter data points in variable resolution circular buffers, consistent with certain disclosed embodiments.

FIG. 3 shows an exemplary flow chart 300 of the steps to compress parameter data points and store compressed parameter data points in variable resolution circular buffers 204, 206, 208. Exemplary flow chart 300 should be understood to represent one possible set of steps in accordance with this disclosure.

In step 302, each of primary data circular buffers 202 may be checked for a new parameter data point entry. If no new parameter data point entries are found, a preset wait time may be entered, and step 302 may be repeated once the preset wait time is complete. If one or more new parameter data point entries are found, step 304 may be executed. Step 304 may check if a trigger condition has been met for variable resolution circular buffer 204. Triggering conditions may include primary data circular buffers 202 becoming full, that is, containing all uncompressed parameter data points, a designated time period has passed since the last parameter data point compression, a certain number of parameter data points have been added to primary data circular buffers 202, or a certain number of parameter data points have been added since the last parameter data point compression. If no triggering condition is found, a preset wait time may be entered, and step 302 may be repeated once the preset wait time is complete. If a triggering condition has been met, step 306 may be executed.

In step 306, the parameter data points associated with the triggering condition that was met in step 304 may be compressed. A calculation may be performed to compress the parameter data points such as averaging the parameter data points, determining either the maximum or the minimum value over the time period or both the maximum and the minimum values over the time period, or determining either the first or the last parameter data point value for the time period or both the first and the last parameter data point values for the time period. The compression may include additional calculations, such as calculating the variance and mean square error, and may include any other statistical properties. The first degree compressed parameter data point calculated in step 306 may be stored during step 306 in first variable resolution circular buffer 204 along with any attendant data, such as time stamp, time period, variance, mean square error, etc. Once the first degree compressed parameter data point is stored, the parameter data points that may have been used to calculate the first degree compressed parameter data point may be deleted, the end of the buffer may be moved to before the first parameter data point that was not used to calculate the first degree compressed parameter data point, or similar methods known in the art may be used to indicate that the buffer is available. For example, the FIFO properties of primary data circular buffer 202 may be used to overwrite the parameter data points used to calculate the first degree compressed parameter data point. If there is only one variable resolution circular buffer 204, and no further data compression is available, then a preset wait time may be entered, and step 302 may be repeated once the preset wait time is complete. If there are additional variable resolution circular buffer 206, 208, then step 308 may be executed next.

Step 308 may check if a trigger condition has been met for second variable resolution circular buffer 206. Triggering conditions may include first variable resolution circular buffer 204 becoming full, that is, containing all first degree compressed parameter data points, a designated time period has passed since the last parameter data point compression, a certain number of first degree compressed parameter data points have been added to first variable resolution circular buffer 204, or a certain number of first degree compressed parameter data points have been added since the last parameter data point compression. If no triggering condition is found, a preset wait time may be entered, and step 302 may be repeated once the preset wait time is complete. If a triggering condition has been met, step 310 may be executed.

In step 310 the first degree compressed parameter data points associated with the triggering condition that was met in step 308 may be compressed. A calculation may be performed to compress the first degree compressed parameter data points such as averaging the first degree compressed parameter data points, determining either the maximum or the minimum value over the time period or both the maximum and the minimum values over the time period, or determining either the first or the last first degree compressed parameter data point value for the time period or both the first and the last first degree compressed parameter data point values for the time period. The compression may include additional calculations, such as calculating the variance and mean square error, and any other statistical properties of interest. The second degree compressed parameter data point calculated in step 310 may be stored during step 310 in second variable resolution circular buffer 206 along with any attendant data, such as time stamp, time period, variance, mean square error, etc. Once the second degree compressed parameter data point is stored, the first degree compressed parameter data points that may have been used to calculate the second degree compressed parameter data point may be deleted, the end of buffer pointer may be moved to before the first first degree compressed parameter data point that was not used to calculate the second degree compressed parameter data point, or similar methods known in the art may be used to indicate that first variable resolution circular buffer 204 is available. For example, the FIFO properties of first variable resolution circular buffer 204 may be used to overwrite the first degree compressed parameter data points used to calculate the second degree compressed parameter data point. If there are only two variable resolution circular buffers 204 and 206, then a preset wait time may be entered, and step 302 may be repeated once the preset wait time is complete. If there are additional variable resolution circular buffers, e.g., 208, additional repetitive steps similar in nature to steps 208 and 210 may be preformed until an exit condition is met that returns to step 302.

Final steps 320 and 322 will always exit and return to step 302 after the appropriate wait period. Final steps 320 and 322 correlate to $n^{th}$ variable resolution circular buffer 208. Step 320 may check if a trigger condition has been met for $n^{th}$ variable resolution circular buffer 208. Triggering conditions may include $n^{th}-1$ variable resolution circular buffer 208 becoming full, that is, it contains all $n^{th}-1$ degree compressed parameter data points, a designated time period has passed since the last parameter data point compression, a certain number of $n^{th}-1$ degree compressed parameter data points have been added to $n^{th}-1$ variable resolution circular buffer 208, and/or a certain number of $n^{th}-1$ degree compressed parameter data points have been added since the last parameter data point compression. If no triggering condition is found, a preset wait time may be entered, and step 302 may be repeated once the preset wait time is complete. If a triggering condition has been met, step 322 may be executed.

In step 322 the $n^{th}-1$ degree compressed parameter data points associated with the triggering condition that was met in step 320 may be compressed. A calculation may be performed to compress the $n^{th}-1$ degree compressed parameter data points such as averaging the $n^{th}-1$ degree compressed parameter data points, determining either the maximum or the minimum value over the time period or both the maximum and the minimum values over the time period, or determining either the first or the last $n^{th}-1$ degree compressed parameter data point value for the time period or both the first and the last $n^{th}-1$ degree compressed parameter data point values for the time period. The compression may include additional calculations, such as calculating the variance and mean square error, and may include any other statistical properties. The $n^{th}$ degree compressed parameter data point calculated in step 322 may be stored during step 322 in $n^{th}$ variable resolution circular buffer 208 along with any attendant data, such as, for example, time stamp, time period, variance, mean square error, etc. Once the $n^{th}$ degree compressed parameter data point is stored, the $n^{th}-1$ degree compressed parameter data points that may have been used to calculate the $n^{th}$ degree compressed parameter data point may be deleted, the end of buffer pointer may be moved to before the first $n^{th}-1$ degree compressed parameter data point that was not used to calculate the $n^{th}$ degree compressed parameter data point, or similar methods known in the art may be used to indicate that $n-1^{th}$ variable resolution circular buffer 208 is available. For example, the FIFO properties of $n-1^{th}$ variable resolution circular buffer 208 may be used to overwrite the $n^{th}-1$ degree compressed parameter data points used to calculate the $n^{th}$ degree compressed parameter data point. Since this is the last variable resolution circular buffer 208, a preset wait time may be entered, and step 302 may be repeated once the preset wait time is complete.

Figure 4:
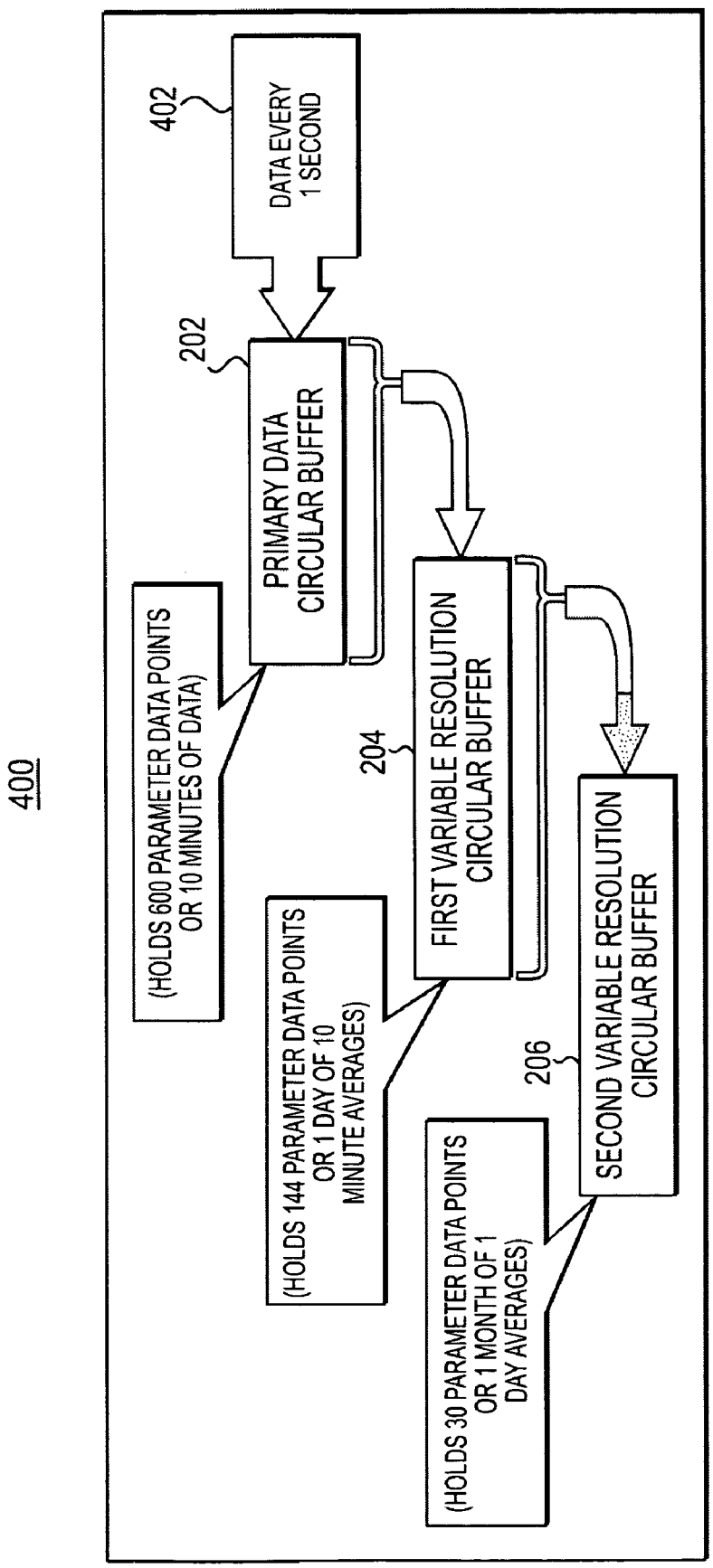
FIG. 4 is an exemplary diagram illustrating another embodiment of an exemplary data compression method, in which all parameter data points in a buffer are compressed, consistent with certain disclosed embodiments.

FIG. 4 shows an exemplary parameter data point compression method 400 useful for implementing parameter data point compression in accordance with one exemplary embodiment. Parameter data point compression method 400 compresses all the parameter data points in primary data circular buffer 202 or compresses all the compressed parameter data points in variable resolution circular buffer 204, 206, 208. Once all the parameter data points or compressed parameter data points are compressed and stored as a single compressed parameter data point on the next highest variable resolution circular buffer 204, 206, 208, the parameter data points or compressed parameter data points that may have been used to calculate the compressed parameter data point may be deleted, primary data circular buffer 202 or variable resolution circular buffer 204, 206, 208 may be marked as cycled, or the FIFO properties of primary data circular buffer 202 or variable resolution circular buffer 204, 206, 208 may be used to allow new parameter data points or compressed parameter data points to be written into primary data circular buffer 202 or variable resolution circular buffer 204, 206, 208.

In one exemplary embodiment, data stream 402 inputs a new parameter data point into primary data circular buffer 202 every second. Primary data circular buffer 202 may have a τ equal to one second, a duration T of ten minutes, and may hold 600 parameter data points. Once primary data circular buffer 202 has 600 parameter data points, all 600 parameter data points may be compressed into a single first degree compressed parameter data point with attendant data, such as, for example, time stamp, time period, variance, mean square error, etc. Once the 600 parameter data points have been compressed into a single first degree compressed parameter data point, primary data circular buffer 202 may be overwritten or deleted.

First variable resolution circular buffers 204 may have a τ1 equal to ten minutes, a duration T1 of one day, and may hold 144 first degree compressed parameter data points. Once first variable resolution circular buffer 204 has 144 first degree compressed parameter data points, all 144 first degree compressed parameter data points may be compressed into a single second degree compressed parameter data point with attendant data, such as, for example, time stamp, time period, variance, mean square error, etc. Once the 144 first degree compressed parameter data points have been compressed into a single second degree compressed parameter data point, first variable resolution circular buffer 204 may be overwritten or deleted.

Second variable resolution circular buffer 206 may have a τ2 equal to one day, a duration T2 of one month, and may hold 30 second degree compressed parameter data points. Because there is no third variable resolution circular buffer 208, second variable resolution circular buffer 206 may apply FIFO and when second variable resolution circular buffer 206 is full, if a new second degree compressed parameter data point is written to second variable resolution circular buffer 206, the oldest entry may be overwritten and lost.

Figure 5:
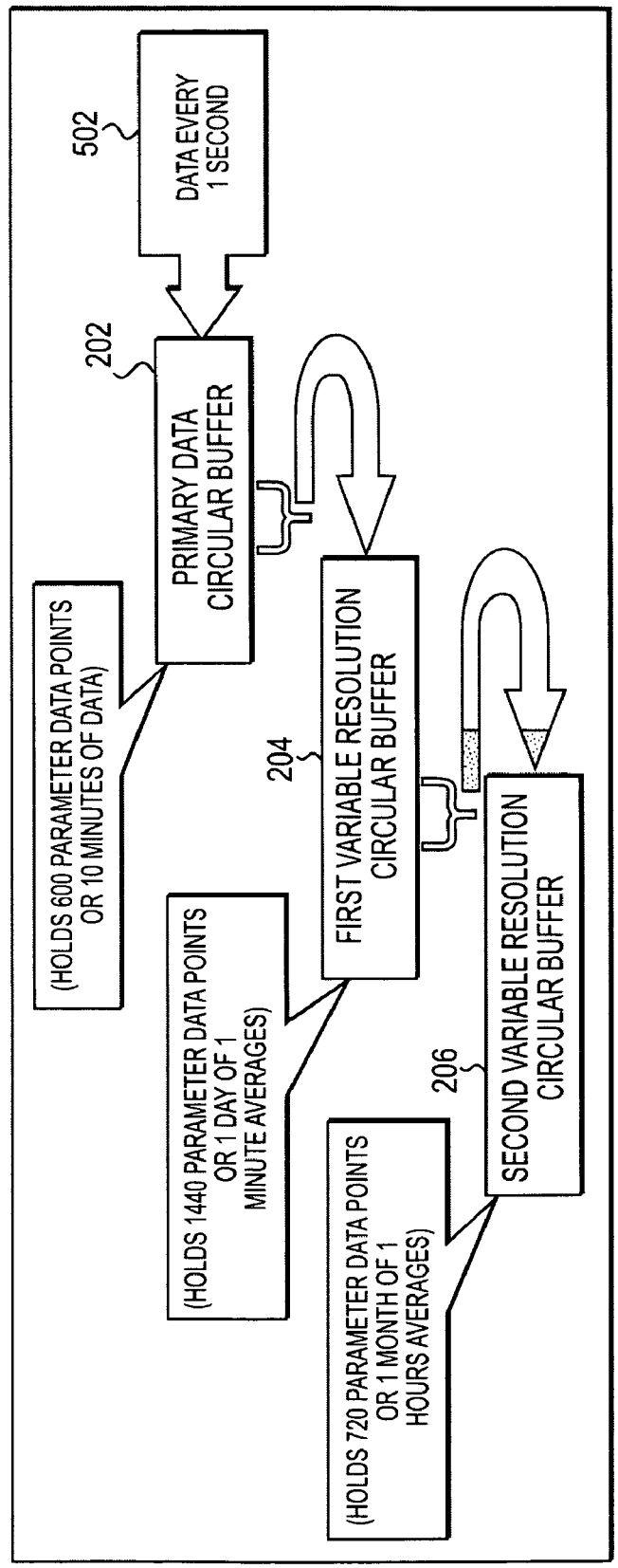
FIG. 5 is an exemplary diagram illustrating another embodiment of an exemplary data compression method, in which a subset of all parameter data points in a buffer are compressed, consistent with certain disclosed embodiments.

FIG. 5 shows an exemplary parameter data point compression method 500 useful for implementing parameter data point compression in accordance with one exemplary embodiment. Parameter data point compression method 500 compresses a subset of the parameter data points in a given primary data circular buffer 202 or compresses a subset of the compressed parameter data points in a given variable resolution circular buffer 204, 206, 208. The subset is chosen based on the position of a pointer indicating the last compressed parameter data point, when a certain time period has past, and/or when not compressing would risk the loss of parameter data points or compressed parameter data points. In one embodiment, the parameter data points or compressed parameter data points to be compressed may be taken from the middle of primary data circular buffer 202 or variable resolution circular buffer 204, 206, 208. In other embodiments, parameter data points or compressed parameter data points may be selected from near the ends of primary data circular buffer 202 or variable resolution circular buffer 204, 206, 208.

Once all the chosen parameter data points are compressed and stored as a single compressed parameter data point on the next highest variable resolution circular buffer 204, 206, 208, the parameter data points that may have been used to calculate the compressed parameter data point may be deleted, the pointer to indicate the last compressed parameter data point may be incremented, or the FIFO properties of primary data circular buffer 202 or variable resolution circular buffer 204, 206, 208 may be used to allow new parameter data points to be written into primary data circular buffer 202 or variable resolution circular buffer 204, 206, 208.

In one exemplary embodiment, data stream 502 inputs a new parameter data point into primary data circular buffer 202 every second. Thus, primary data circular buffer 202 may have a τ equal to one second, a duration T of ten minutes, and may hold 600 parameter data points. When some predetermined criteria is met, 60 parameter data points may be compressed into a single first degree compressed parameter data point with attendant data, such as, for example, time stamp, time period, variance, mean square error, etc. Once the 60 parameter data points have been compressed into a single first degree compressed parameter data point, primary data circular buffer 202 may increment its pointer, and/or the parameter data points used to calculate the first degree compressed parameter data point may be deleted.

First variable resolution circular buffer 204 may have a τ1 equal to one minute, a duration T1 of one day, and may hold 1440 first degree compressed parameter data points. Thus, when some predetermined criteria is met, 60 first degree compressed parameter data points may be compressed into a single second degree compressed parameter data point with attendant data, such as, for example, time stamp, time period, variance, mean square error, etc. Once the 60 first degree compressed parameter data points have been compressed into a single second degree compressed parameter data point, first variable resolution circular buffer 204 may increment one of its pointers, or the first degree compressed parameter data points used to calculate the second degree compressed parameter data point may be deleted.

Second variable resolution circular buffer 206 may have a τ2 equal to one hour, a duration T2 of one month, and may hold 720 second degree compressed parameter data points. Because there is no third variable resolution circular buffer 208, second variable resolution circular buffer 206 may apply FIFO and when second variable resolution circular buffer 206 is full, if a new second degree compressed parameter data point is written to second variable resolution circular buffer 206, the oldest entry may be overwritten and lost.

Figure 6:
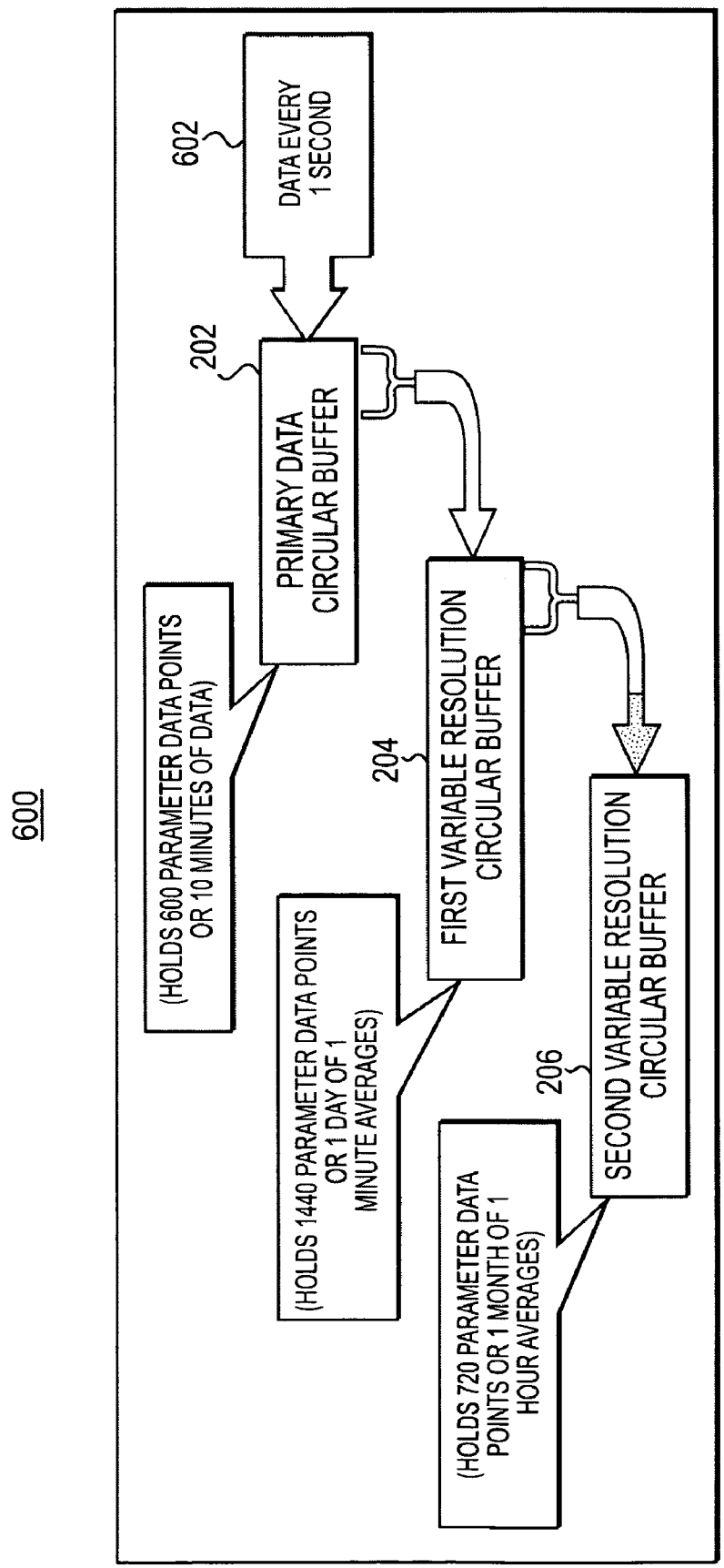
FIG. 6 is an exemplary diagram illustrating another embodiment of an exemplary data compression method, in which a subset of all parameter data points in a buffer are compressed, consistent with certain disclosed embodiments.

FIG. 6 shows an exemplary parameter data point compression method 600 useful for implementing parameter data point compression in accordance with one exemplary embodiment. Parameter data point compression method 600 may compress a subset of the parameter data points in a given primary data circular buffer 202 or compress a subset of the compressed parameter data points in a given variable resolution circular buffer 204, 206, 208. The subset is chosen such that as soon as a sufficient number of not previously compressed parameter data points are in primary data circular buffer 202 or compressed parameter data points are in variable resolution circular buffer 204, 206, 208, they may be compressed. This may be done, for example, to create overlapping fidelity.

Once all the chosen parameter data points or compressed parameter data points are compressed and stored as a single compressed parameter data point on the next highest variable resolution circular buffer 204, 206, 208, the pointer to indicate the last compressed parameter data point may be incremented and/or the FIFO properties of primary data circular buffer 202 or variable resolution circular buffer 204, 206, 208 may be used to allow new parameter data points or compressed parameter data points to be eventually written into those positions on primary data circular buffer 202 or variable resolution circular buffer 204, 206, 208.

In one exemplary embodiment, data stream 602 inputs a new parameter data point into primary data circular buffer 202 every second. Thus, primary data circular buffer 202 may have a τ equal to one second, a duration T of ten minutes, and may hold 600 parameter data points. When 60 parameter data points that have not previously been compressed have been stored into primary data circular buffer 202, those 60 parameter data points may be compressed into a single first degree compressed parameter data point with attendant data, such as, for example, time stamp, time period, variance, mean square error, etc. Once the 60 parameter data points have been compressed into a single first degree compressed parameter data point, the pointer to indicate the last compressed parameter data point on primary data circular buffer 202 may be incremented and/or the FIFO properties of primary data circular buffer 202 may be used to allow new parameter data points to be written into those positions on primary data circular buffer 202.

First variable resolution circular buffers 204 may have a τ1 equal to one minute, a duration T1 of one day, and may hold 1440 first degree compressed parameter data points. Thus, when 60 first degree compressed parameter data points that have not previously been compressed on first variable resolution circular buffers 204 are stored into first variable resolution circular buffers 204, those 60 first degree compressed parameter data points may be compressed into a single second degree compressed parameter data point with attendant data, such as, for example, time stamp, time period, variance, mean square error, etc. Once the 60 first degree compressed parameter data points have been compressed into a single second degree compressed parameter data point, the pointer to indicate the last first degree compressed parameter data point on first variable resolution circular buffer 204 may be incremented and/or the FIFO properties of first variable resolution circular buffer 204 may be used to allow new first degree compressed parameter data points to be written into those positions on first variable resolution circular buffer 204.

Second variable resolution circular buffer 206 may have a τ2 equal to one hour, a duration T2 of one month, and may hold 720 second degree compressed parameter data points. Because there is no third variable resolution circular buffer 208, second variable resolution circular buffer 206 may apply FIFO and when second variable resolution circular buffer 206 is full, if a new second degree compressed parameter data point is written to second variable resolution circular buffer 206, the oldest entry may be overwritten and lost.

Figure 7:
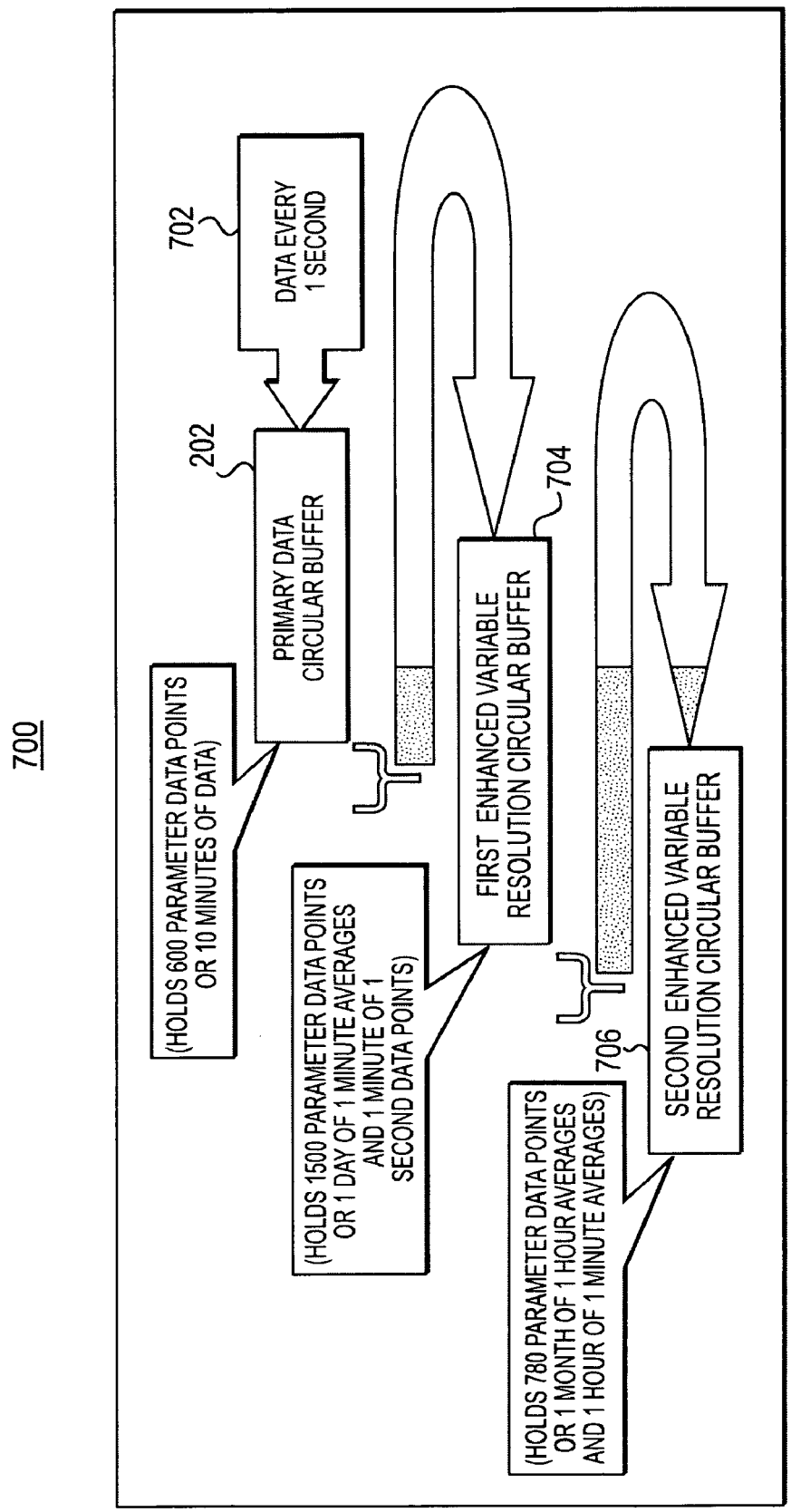
FIG. 7 is an exemplary diagram illustrating another embodiment of an exemplary data compression method, in which a subset of all parameter data points in a buffer are compressed, consistent with certain disclosed embodiments.

FIG. 7 shows an alternate exemplary parameter data point compression method 700 useful for implementing parameter data point compression in accordance with one exemplary embodiment. Parameter data point compression method 700 utilizes first enhanced variable resolution circular buffers 704 which stores parameter data points from primary data circular buffer 202 and second enhanced variable resolution circular buffers 704 which stores first degree compressed parameter data points from first enhanced variable resolution circular buffer 704 until sufficient parameter data points or compressed parameter data points are available for compression. It is envisioned that a parameter data point on primary data circular buffer 202 or a first degree compressed parameter data point on first enhanced variable resolution circular buffer 704, before it is written over by the newest parameter data point or first degree compressed parameter data point entry on that circular buffer, may be written to the next enhanced variable resolution buffer 704, 706.

Once all the parameter data points or compressed parameter data points are compressed and stored as a single compressed parameter data point on enhanced variable resolution circular buffer 704, 706, the parameter data points or compressed parameter data points that may have been used to calculate the compressed parameter data point may be deleted, the pointer to indicate the last compressed parameter data point may be incremented, enhanced variable resolution circular buffer 704, 706 may be marked as cycled, or the FIFO properties of primary data circular buffer 202 or first enhanced variable resolution circular buffer 704 may be used to allow new parameter data points to be written into primary data circular buffer 202 or first enhanced variable resolution circular buffer 704.

In one exemplary embodiment, data stream 702 may input a new parameter data point into primary data circular buffer 202 every second. Thus, primary data circular buffer 202 may have a τ equal to one second, a duration T of ten minutes, and may hold 600 parameter data points. When primary data circular buffer 202 is full, before the oldest parameter data point entry is overwritten, the oldest parameter data point may be stored in first enhanced variable resolution circular buffer 704. Once the parameter data point has been stored, primary data circular buffer 202 may increment one of its pointers, or the parameter data point stored may be deleted or overwritten.

First enhanced variable resolution circular buffer 704 may have a τ1 equal to one minute, a duration T1 of one day, and may hold 1440 first degree compressed parameter data points and 60 uncompressed parameter data points. When 60 parameter data points from primary data circular buffer 202 have been stored on first enhanced variable resolution circular buffer 704 and those parameter data points have not been previously compressed, the parameter data points may be compressed into a single first degree compressed parameter data point with attendant data, such as, for example, time stamp, time period, variance, mean square error, etc. Once the 60 parameter data points have been compressed into a single first degree compressed parameter data point, first enhanced variable resolution circular buffer 704 may increment one of its pointers, or the parameter data points used to calculate the first degree compressed parameter data point may be deleted or overwritten. When first enhanced variable resolution circular buffer 704 is full, before the oldest first degree compressed parameter data point entry is overwritten, the oldest first degree compressed parameter data point may be stored in second enhanced variable resolution circular buffer 706. Once the first degree compressed parameter data point has been stored, first enhanced variable resolution circular buffer 704 may increment one of its pointers, or the first degree compressed parameter data point stored may be deleted or overwritten.

Second enhanced variable resolution circular buffer 706 may have a τ2 equal to one hour, a duration T2 of one month, and may hold 720 second degree compressed parameter data points with one hour averages and 60 first degree compressed parameter data points with one minute averages. When 60 first degree compressed parameter data points from first enhanced variable resolution circular buffer 704 have been stored on second enhanced variable resolution circular buffer 706, and not previously compressed on second enhanced variable resolution circular buffer 706, the 60 first degree compressed parameter data points may be compressed into a single second degree compressed parameter data point with attendant data, such as, for example, time stamp, time period, variance, mean square error, etc. Once the 60 first degree compressed parameter data points have been compressed into a single second degree compressed parameter data point, second enhanced variable resolution circular buffer 706 may increment one of its pointers, or the first degree compressed parameter data points used to calculate the second degree compressed parameter data point may be deleted or overwritten. Because there is no third enhanced variable resolution circular buffer, second enhanced variable resolution circular buffer 706 may apply FIFO and when second enhanced variable resolution circular buffer 706 is full, if a new second degree compressed parameter data point with a one hour average is written to second enhanced variable resolution circular buffer 706, the oldest entry may be overwritten and lost.

Figure 8:
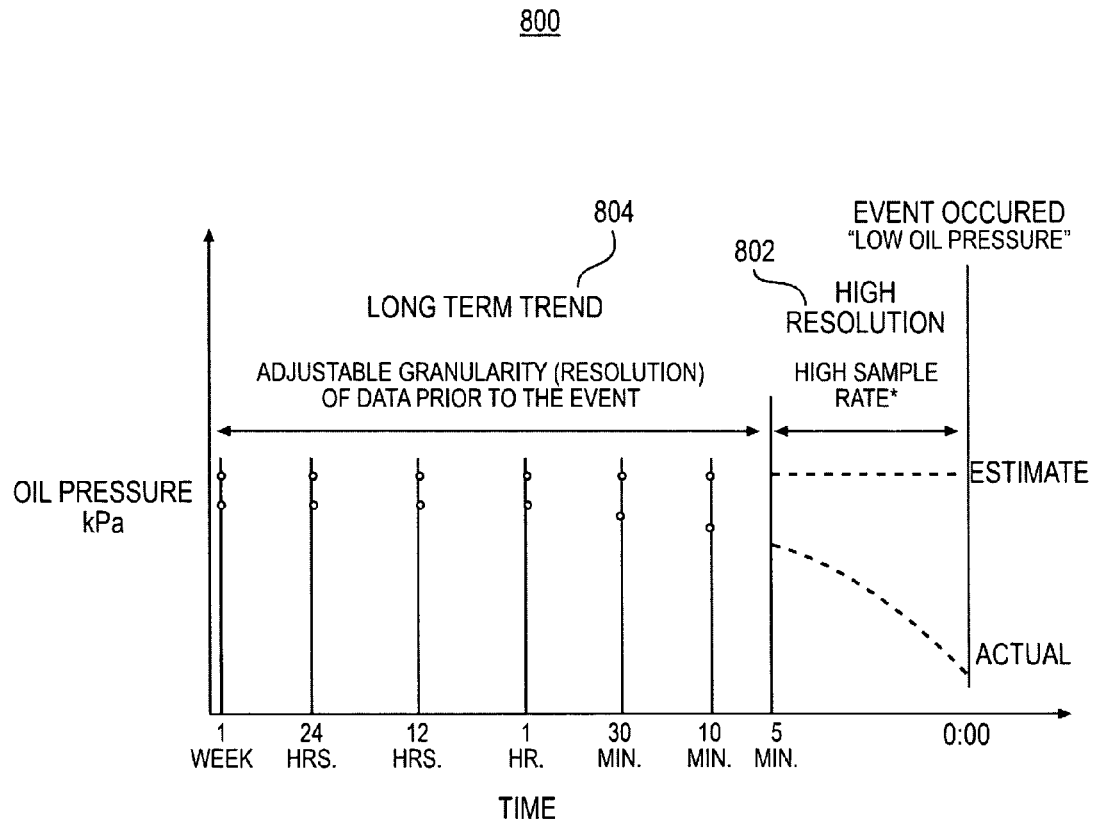
FIG. 8 is an exemplary diagram, illustrating an exemplary event and variable resolution trend, consistent with certain disclosed embodiments.

FIG. 8 is an example of an event and a variable resolution trend 210 consistent with one exemplary embodiment. The exemplary embodiment of FIG. 8 shows a low oil pressure event and an oil pressure variable resolution trend 800. In one exemplary embodiment, when the event occurs, it is reported by data processor and controller 114 to off-board system 110. Alternatively, and/or additionally, the event may be reported as soon as direct data link 120 or wireless communication link 122 is established. Off-board system 110 may then request parameter data points for one or more operational parameters including compressed parameter data points from data processor and controller 114. The parameter data points requested may be in the form of a variable resolution trend 210. In another exemplary embodiment, when the event occurs, data processor and controller 114 may generate a report and send the report to off-board system 110. Alternatively, and/or additionally, the event may be reported as soon as direct data link 120 or wireless communication link 122 is established. The report may include high resolution parameter data points and older, compressed parameter data points. The report may be in the form of a variable resolution trend 210.

A variable resolution trend 210 may contain some duration of high resolution parameter data points. The frequency of parameter data points may be at the sampling rate, or may be at some integer multiple of the sampling rate. Variable resolution trend 210 also may contain some duration of long term trend data, usually in the form of compressed parameter data points. The compressed parameter data points may be reported at their sampling rate for the duration of each compression rate, or in an alternate embodiment, representative compressed parameter data points may be selected and reported, as in FIG. 8.

In the embodiment in FIG. 8, high resolution 802 parameter data points for oil pressure in kilopascals may be reported every second. The duration of high resolution 802 parameter data points may be five minutes. Long-term trend 804 data may be compressed parameter data points selected from one or more of variable resolution circular buffers 204, 206, 208. In one exemplary embodiment, compressed parameter data points may include a time 10 minutes before the event, 30 minutes before the event, 1 hour before the event, 12 hours before the event, 24 hours before the event, and 1 week before the event. The set of compressed parameter data points in long-term trend 804 may provide data showing conditions before the event. In an alternate embodiment, for example, long-term trend 804 data may include compressed parameter data points as shown in FIG. 2. Long-term trend 804 may contain, for example, 6 first degree compressed parameter data points with attendant time stamp and time period, spaced ten minutes apart, covering a duration of 1 hour, and 24 second degree compressed parameter data points with attendant time stamp and time period, spaced 1 hour apart, covering a duration of 24 hours, for a total duration of 1 day, 1 hour, and 6 minutes. The density in time of parameter data points reported to off-board system 110 may be most dense near the triggering event or time of reporting, and the density in time of parameter data points may become less dense in time further away from the triggering event or time of reporting.

The present disclosure may be implemented in a variety of data communication network environments using software, hardware, or a combination of hardware and software to provide the processing functions. Those skilled in the art will appreciate that all or part of systems and methods consistent with the present disclosure may be stored on or read from other computer-readable media. Furthermore, one skilled in the art will also realize that the processes illustrated in this description may be implemented in a variety of ways and include multiple other modules, programs, applications, scripts, processes, threads, or code sections that may all functionally interrelate with each other to accomplish the individual tasks described. For example, it is contemplated that these programs, modules, etc., may be implemented using commercially available software tools, using custom object-oriented code written in the C++ programming language, using applets written in the Java programming language, or may be implemented with discrete electrical components and/or integrated circuits (ASIC) designed for this purpose Implementation of the disclosure may, to some extent, be undertaken manually. For example, designated persons, such as administrators, engineers, maintenance technicians, owners and/or retailers with the authority to use off-board system 110 and/or machine 101 may determine the pool of available operational parameters and/or events to be monitored and recorded. It is contemplated, however, that either a manual, semi-computerized, or fully computerized implementation may be utilized.

INDUSTRIAL APPLICABILITY

The disclosed data acquisition system 100 may be applicable, for example, to any machine 101 where parameter data points are transmitted from machine 101 to an off-board system 110, whether as part of reporting an event, or as part of a regular parameter data point reporting scheme. For example, this disclosure may be applicable where machine 101 may have limited opportunity to communicate with off-board system 110 or may have limited bandwidth to communicate with off-board system 110. Machine 101 may also have a limited storage capacity, and may discard old data as new data becomes available. Parameter data point compression method 200 of data acquisition system 100 may reduce the memory required on machine 101, may reduce the bandwidth needed to transmit parameter data points from machine 101 to off-board system 110, may allow trending of operational parameters, and may be applied to the actual values of the parameter data points rather than the sensed signals. The operation of data acquisition system 100 will now be described in detail.

In one aspect, a machine 101 may be in operation, and parameter data points may be sensed, processed, and stored in primary data circular buffer 202. When primary data circular buffer 202 is full, or some criteria has been met, such as a certain number of parameter data points have been stored in primary data circular buffer 202 passed a pointer, or a time duration has passed, some number of parameter data points may be compressed, up to all the parameter data points in primary data circular buffer 202. In one exemplary embodiment, parameter data points may be compressed into a single first degree compressed parameter data point, with an attendant time stamp and time period. In a further exemplary embodiment, additional information about or associated with the compression may also be retained, such as the variance and mean square error associated with the parameter data points that were compressed. The first degree compressed parameter data point and its attendant data may be stored in first variable resolution circular buffer 204.

First variable resolution circular buffer 204 may store one or more first degree compressed parameter data points of one or more operational parameters. When first variable resolution circular buffer 204 is full, or some criteria has been met, such as a certain number of first degree compressed parameter data points have been stored, passed a pointer in first variable resolution circular buffer 204, and/or a time duration has passed, some number of first degree compressed parameter data points may be compressed, any number up to and including all the first degree compressed parameter data points in first variable resolution circular buffer 204. In one exemplary embodiment, first degree compressed parameter data points may be further compressed into a single second degree compressed parameter data point, with an attendant time stamp and time period. In a further exemplary embodiment, additional information about or associated with the compression may also be retained, such as the variance and mean square error associated with the first degree compressed parameter data points that were compressed. The second degree compressed parameter data point and its attendant data may be stored in second variable resolution circular buffer 206.

Second variable resolution circular buffer 206 may store one or more second degree compressed parameter data points of one or more operational parameters. When second variable resolution circular buffer 206 is full, or some criteria has been met, such as, for example, a certain number of second degree compressed parameter data points have been stored passed a pointer in second variable resolution circular buffer 206, and/or a time duration has passed, some number of second degree compressed parameter data points may be compressed, up to all the second degree compressed parameter data points in second variable resolution circular buffer 206. In one exemplary embodiment, second degree compressed parameter data points may be further compressed into a single third degree compressed parameter data point, with an attendant time stamp and time period. In a further exemplary embodiment, additional information about or associated with the compression may also be retained, such as, for example, the variance and mean square error associated with the second degree compressed parameter data points that were compressed. The third degree compressed parameter data point and its attendant data may be stored in third variable resolution circular buffer 208. The process continues until last variable resolution circular buffer 208.

Last, or $n^{th}$ variable resolution circular buffer 208 may store one or more $n^{th}$ degree compressed parameter data points of one or more operational parameters. $N^{th}$ variable resolution circular buffer 208 may use a first in, first out (FIFO) system for data overflows. In one exemplary embodiment, when $n^{th}$ variable resolution circular buffer 208 is full, since no additional variable resolution circular buffer 208 is available, then a FIFO rule is applied, and the oldest $n^{th}$ degree compressed parameter data point is overwritten with the newest $n^{th}$ degree compressed parameter data point in $n^{th}$ variable resolution circular buffer 208.

When communication module 108 is able to establish direct data link 120 or wireless communication link 122 with off-board system 110, either as a result of scheduled reports, return of availability of direct data link 120 or wireless communication link 122, or as the result of the occurrence of an event, either a download of parameter data points or variable resolution trend 210 may be sent by data processor and controller 114 through communication module 108 to off-board system 110. The density in time of parameter data points reported to off-board system 110 may be most dense near the triggering event or time of reporting, and the density in time of parameter data points may become less dense in time further away from the triggering event or time of reporting.

During subsequent machine 101 operation, data processor and controller 114 may continually or periodically sample the signals provided by sensors 116a-d and convert the sensed signals into machine storable parameter data points. Data processor and controller 114 may monitor and determine the parameter data points of the operational parameters of machine 101 based on the signals provided by sensors 116a-d, and compare the monitored values to the stored values for operational parameters associated with each event in the tables. In one scenario, for example, machine 101 may be traveling at a relatively high speed down a steep incline. In bringing machine 101 to a complete stop on the incline, the operator may engage the brakes of machine 101. Based on a temperature signal from one or more of the brakes exceeding a temperature trigger value selected by the user or operator and stored in the table(s) of data processor and controller 114, data processor and controller 114 may determine that a brake overheat event has been triggered, and should be reported to off-board system 110.

By employing the disclosed data acquisition system 100 on machine 101, as discussed above, a user may store parameter data points showing behavior over a several weeks or months span, without storing signals, and with limited storage capacity. Extending the storage duration of available parameter data points may enhance the diagnostic value of the event reports. Particularly, the parameter data points, and the attendant data, provide information on the predictability and variability of the compressed parameter data points. Further, the parameter data points that are returned and/or reported upon the triggering of a particular event may be in a digital form, or recorded as a value, allowing manipulation and calculation of parameter data points on machine 101 or by off-board system 110. The parameter data points may be in multiple, varying resolutions in time, providing an extended view of past behavior. Another advantage of the disclosed data acquisition system 100 is the trend data is a running compression, maintained in real time, and is ready when a scheduled report is due or upon return of availability of direct data link 120 or wireless communication link 122, or as the result of the occurrence of an event. It should be clear that the disclosed method and system could be extended beyond machines 101 and may be applied where operational parameter sampling, storage, and analysis would be useful.

It will be apparent to those skilled in the art that various modifications and variations can be made to the disclosed data acquisition system. Other embodiments will be apparent to those skilled in the art from consideration of the specification and practice of the disclosed data acquisition system. It is intended that the specification and examples be considered as exemplary only, with a true scope of the invention being indicated by the following claims.

What is claimed is:

1. A data acquisition system, comprising:
    a sensor disposed on a machine and configured to produce a signal indicative of an operational parameter of the machine;
    a data processor and controller configured to convert the signal into a plurality of parameter data points;
    a primary data circular buffer disposed on the machine and configured to store the plurality of parameter data points; and
    a variable resolution circular buffer disposed on the machine and configured to store a compressed parameter data point calculated from the plurality of parameter data points.

2. The data acquisition system of claim 1, wherein the variable resolution circular buffer is a first variable resolution circular buffer and the system further includes a second variable resolution circular buffer disposed on the machine and configured to store compressed parameter data points calculated from a plurality of compressed parameter data points.

3. The data acquisition system of claim 1, wherein the variable resolution circular buffer is a first variable resolution circular buffer and the system further includes a second and third variable resolution circular buffers disposed on the machine and configured to store compressed parameter data points calculated from parameter data points or calculated from compressed parameter data points, the three variable resolution circular buffers including a first variable resolution circular buffer storing compressed parameter data points calculated from parameter data points stored in the primary data circular buffer, a second variable resolution circular buffer storing compressed parameter data points calculated from compressed parameter data points stored in the first variable resolution circular buffer, and a third variable resolution circular buffer storing compressed parameter data points calculated from compressed parameter data points stored in the second variable resolution circular buffer.

4. The data acquisition system of claim 1, further including a communication module configured to communicate the parameter data points and compressed parameter data points to an off-board system for storage or analysis.

5. The data acquisition system of claim 4, wherein the communication module is configured to wirelessly communicate with the off-board system.

6. The data acquisition system of claim 1, wherein the data acquisition system is configured to calculate a representative compressed parameter data point for a time period of parameter data points.

7. The data acquisition system of claim 6, wherein the data acquisition system is configured to calculate and store for the representative compressed parameter data point one or more of the following:
    a minimum parameter data point value;
    a maximum parameter data point value;
    a variance;
    a standard deviation;
    a number of parameter data points compressed; and
    the time period of the compressed parameter data point.

8. The data acquisition system of claim 6, wherein the representative compressed parameter data point is the average of the parameter data points for the time period of parameter data points to be compressed.

9. A method of acquiring machine data, comprising:
    sensing a signal associated with an operational parameter of a machine;
    converting the sensed signal into a plurality of parameter data points;
    storing the plurality of parameter data points in a primary circular data buffer; and
    compressing and storing a compressed parameter data point in a variable resolution circular buffer.

10. The method of claim 9, further including storing a compressed parameter data point calculated from a plurality of compressed parameter data points.

11. The method of claim 10, further including storing two series of compressed parameter data points calculated from other series of compressed parameter data points, wherein a first compressed parameter data point is calculated from a series of parameter data points, a second compressed parameter data point is calculated from a series of first compressed parameter data points, and a third compressed parameter data point is calculated from the second series of compressed parameter data points.

12. The method of claim 9, further including communicating the parameter data points and compressed parameter data points to an off-board system for storage or analysis.

13. The method of claim 9, wherein compressing and storing includes calculating a representative compressed parameter data point for a time period of parameter data points.

14. The method of claim 13, wherein compressing and storing includes calculating and storing for each compressed parameter data point one or more of the following:
    a minimum parameter data point value;
    a maximum parameter data point value;

a variance;
a standard deviation;
a number of parameter data points compressed; and
the time period of the compressed parameter data point.

15. The method of claim 13, wherein compressing and storing further includes calculating an average of the parameter data points and storing the average as the compressed parameter data point for the time period of parameter data points to be compressed.

16. The method of claim 9, further comprising calculating and storing a value indicative of a predictability or variability of the compressed parameter data point.

17. A machine, comprising:
a power source configured to power operations of the machine;
a frame operatively coupled to the power source; and
a data acquisition system disposed on the machine, including:
  a sensor disposed on the machine and configured to produce a signal indicative of an operational parameter of the machine;
  a data processor and controller configured to convert the signal into a plurality of parameter data points;
  a primary data circular buffer disposed on the machine and configured to store the plurality of parameter data points; and
  a variable resolution circular buffer disposed on the machine and configured to store a compressed parameter data point calculated from the plurality of parameter data points, wherein the data acquisition system is configured to calculate the compressed parameter data point as an average of the plurality of parameter data points, a minimum of the plurality of parameter data points, or a maximum of the plurality of parameter data points.

18. The machine of claim 17, wherein the variable resolution circular buffer is a first variable resolution circular buffer and the machine further includes a second and third variable resolution circular buffers disposed on the machine and configured to store compressed parameter data points calculated from parameter data points or calculated from compressed parameter data points, the three variable resolution circular buffers including a first variable resolution circular buffer storing compressed parameter data points calculated from parameter data points stored in the primary data circular buffer, a second variable resolution circular buffer storing compressed parameter data points calculated from compressed parameter data points stored in the first variable resolution circular buffer, and a third variable resolution circular buffer storing compressed parameter data points calculated from compressed parameter data points stored in the second variable resolution circular buffer.

19. The machine of claim 17, further including a communication module configured to wirelessly communicate the parameter data points and compressed parameter data points to an off-board system for storage or analysis.

20. The machine of claim 17, wherein the data acquisition system is configured to calculate a representative compressed parameter data point for a time period of parameter data points and store the representative compressed parameter data point as one compressed parameter data point, and the data acquisition system is further configured to calculate and store for each compressed parameter data point one or more of the following:
a variance;
a standard deviation;
a number of parameter data points compressed; and
the time period of the compressed parameter data point.

21. The machine of claim 20, wherein the representative compressed parameter data point is the average of the parameter data points for the time period of parameter data points to be compressed.

* * * * *